(12) United States Patent
Cai et al.

(10) Patent No.: US 11,022,383 B2
(45) Date of Patent: Jun. 1, 2021

(54) INTERFACE-FREE THERMAL MANAGEMENT SYSTEM FOR HIGH POWER DEVICES CO-FABRICATED WITH ELECTRONIC CIRCUIT

(71) Applicant: TELEDYNE SCIENTIFIC & IMAGING, LLC., Thousand Oaks, CA (US)

(72) Inventors: Steve Q. Cai, Newbury Park, CA (US); Avijit Bhunia, Newbury Park, CA (US); Tadej Semenic, Thousand Oaks, CA (US)

(73) Assignee: TELEDYNE SCIENTIFIC & IMAGING, LLC, Thousand Oaks, CA (US)

( * ) Notice: Subject to any disclaimer, the term of this patent is extended or adjusted under 35 U.S.C. 154(b) by 381 days.

(21) Appl. No.: 15/184,891

(22) Filed: Jun. 16, 2016

(65) Prior Publication Data

US 2017/0363373 A1    Dec. 21, 2017

(51) Int. Cl.
*F28F 3/04* (2006.01)
*F28D 15/02* (2006.01)
(Continued)

(52) U.S. Cl.
CPC .......... *F28F 3/048* (2013.01); *F28D 15/0233* (2013.01); *F28D 15/046* (2013.01); *H01L 23/427* (2013.01); *F28D 2021/0028* (2013.01); *F28F 2255/18* (2013.01); *F28F 2260/00* (2013.01)

(58) Field of Classification Search
CPC .... F28F 3/048; F28D 15/0266; H01L 23/427; H04M 1/0202; G06F 1/203; H05K 7/20336
See application file for complete search history.

(56) References Cited

U.S. PATENT DOCUMENTS 3,815,575 A    6/1974 Danis
4,352,392 A    10/1982 Eastman
(Continued)

OTHER PUBLICATIONS

A. M. Jacobi, Department of Mechanical and Industrial Engineering, University of Illinois at Urbana-Champaign, Urbana, Illinois 61801 ; R. K. Shah Delphi Harrison Thermal Systems, Lockport, New York 14094 Heat Transfer Surface Enhancement through the Use of Longitudinal Vortices: A Review of Recent Progress Experimental Thermal and Fluid Science 1995.
(Continued)

*Primary Examiner* — Gordon A Jones
(74) *Attorney, Agent, or Firm* — K&L Gates LLP

(57) ABSTRACT

A thermal-interface-material (TIM)-free thermal management apparatus includes a thermally-conductive unitary structure having an integrated circuit (IC) side and cooling system side, the thermally-conductive unitary structure including a plurality of high aspect ratio micro-pillars or porous structures extending from the IC side and a cooling system extending from the cooling system side. The cooling system may be selected from the group consisting of: a vapor chamber, micro-channel cooler, jet-impingement chamber, and air-cooled heat sink. The cooling system and the plurality of high aspect ratio micro-pillars form part of the same homogenous and thermally-conductive unitary structure.

12 Claims, 4 Drawing Sheets

(51) Int. Cl.
*F28D 15/04* (2006.01)
*H01L 23/427* (2006.01)
*F28D 21/00* (2006.01)

(56) References Cited

U.S. PATENT DOCUMENTS

| | | | |
|---|---|---|---|
| 4,931,424 A | 6/1990 | Henty | |
| 5,168,348 A | 12/1992 | Chu et al. | |
| 5,270,572 A | 12/1993 | Nakajima et al. | |
| 5,316,075 A | 5/1994 | Quon et al. | |
| 5,349,831 A | 9/1994 | Daikoku et al. | |
| 5,353,865 A | 10/1994 | Adiutori et al. | |
| 5,471,367 A * | 11/1995 | Krumweide | H05K 7/1418 165/185 |
| 5,687,577 A | 11/1997 | Ballard et al. | |
| 5,719,444 A | 2/1998 | Tilton et al. | |
| 5,847,927 A | 12/1998 | Minning et al. | |
| 5,959,351 A | 9/1999 | Sasaki et al. | |
| 5,966,291 A | 10/1999 | Baumel et al. | |
| 5,978,220 A | 11/1999 | Frey et al. | |
| 6,366,462 B1 * | 4/2002 | Chu | H01L 23/427 165/80.4 |
| 6,414,867 B2 | 7/2002 | Suzuki et al. | |
| 6,452,798 B1 | 9/2002 | Smith et al. | |
| 6,473,303 B2 | 10/2002 | Kaufmann | |
| 6,594,149 B2 | 7/2003 | Yamada et al. | |
| 6,650,542 B1 | 11/2003 | Chrysler et al. | |
| 6,736,192 B2 | 5/2004 | Chang | |
| 6,738,253 B2 | 5/2004 | Beuille et al. | |
| 6,993,926 B2 | 2/2006 | Rini et al. | |
| 6,994,151 B2 | 2/2006 | Zhou et al. | |
| 7,035,104 B2 | 4/2006 | Meyer | |
| 7,042,725 B2 | 5/2006 | Martin et al. | |
| 7,092,254 B1 | 8/2006 | Monsef et al. | |
| 7,173,823 B1 | 2/2007 | Rinehart et al. | |
| 7,190,581 B1 | 3/2007 | Hassani et al. | |
| 7,255,153 B2 | 8/2007 | Berger et al. | |
| 7,288,438 B2 | 10/2007 | Lu | |
| 7,336,486 B2 | 2/2008 | Mongia | |
| 7,344,576 B2 | 3/2008 | Tegrotenhuis et al. | |
| 7,353,859 B2 | 4/2008 | Stevanovic et al. | |
| 7,369,409 B2 | 5/2008 | Yazawa | |
| 7,375,962 B2 | 5/2008 | Campbell et al. | |
| 7,417,857 B2 | 8/2008 | Rondier et al. | |
| 7,450,378 B2 | 11/2008 | Nelson et al. | |
| 7,536,870 B2 | 5/2009 | Bezama et al. | |
| 7,603,775 B2 | 10/2009 | Meng et al. | |
| 7,651,601 B2 | 1/2010 | Hwang et al. | |
| 7,755,898 B2 | 7/2010 | Aoki et al. | |
| 7,760,503 B2 | 7/2010 | Aoki et al. | |
| 7,859,103 B2 | 12/2010 | Aoki et al. | |
| 7,884,468 B2 | 2/2011 | Mann et al. | |
| 7,992,627 B2 | 8/2011 | Bezama et al. | |
| 8,327,540 B2 | 12/2012 | Michel et al. | |
| 9,484,284 B1 * | 11/2016 | Gambin | H01L 23/4735 |
| 9,721,868 B2 * | 8/2017 | Lin | H01L 23/5226 |
| 9,835,363 B2 * | 12/2017 | Xiao | F25B 39/02 |
| 10,096,537 B1 * | 10/2018 | Chen | H01L 23/427 |
| 10,306,802 B1 * | 5/2019 | Ditri | H01L 23/4735 |
| 2001/0014029 A1 * | 8/2001 | Suzuki | H02M 7/003 363/141 |
| 2002/0144785 A1 | 10/2002 | Srivastava et al. | |
| 2003/0056892 A1 | 3/2003 | Petitbon et al. | |
| 2003/0141045 A1 | 7/2003 | Oh et al. | |
| 2004/0069451 A1 | 4/2004 | Meyer | |
| 2004/0140053 A1 | 7/2004 | Srivastava et al. | |
| 2005/0092403 A1 | 5/2005 | Lloyd | |
| 2005/0199372 A1 | 9/2005 | Frazer et al. | |
| 2005/0211427 A1 * | 9/2005 | Kenny | F28D 15/0266 165/299 |
| 2005/0280128 A1 | 12/2005 | Mok et al. | |
| 2006/0042825 A1 | 3/2006 | Lu et al. | |
| 2006/0060328 A1 | 3/2006 | Ewes et al. | |
| 2006/0087816 A1 | 4/2006 | Ewes et al. | |
| 2006/0108098 A1 | 5/2006 | Stevanovic et al. | |
| 2006/0126308 A1 * | 6/2006 | Campbell | F28F 3/022 361/719 |
| 2006/0144565 A1 | 7/2006 | Tsai et al. | |
| 2006/0164805 A1 | 7/2006 | Meinders et al. | |
| 2006/0174643 A1 | 8/2006 | Ostrom et al. | |
| 2006/0196640 A1 | 9/2006 | Siu | |
| 2006/0250774 A1 | 11/2006 | Campbell et al. | |
| 2007/0121299 A1 | 5/2007 | Campbell et al. | |
| 2007/0166554 A1 | 7/2007 | Ruchert et al. | |
| 2007/0295480 A1 | 12/2007 | Campbell et al. | |
| 2008/0164010 A1 | 7/2008 | Kang et al. | |
| 2008/0225482 A1 | 9/2008 | Smith et al. | |
| 2008/0266801 A1 | 10/2008 | Weiss et al. | |
| 2008/0283223 A1 | 11/2008 | Chang et al. | |
| 2009/0014562 A1 | 1/2009 | Rini et al. | |
| 2009/0032937 A1 | 2/2009 | Mann et al. | |
| 2009/0033410 A1 | 2/2009 | Nelson et al. | |
| 2009/0057882 A1 | 3/2009 | Gerbsch | |
| 2009/0166003 A1 | 7/2009 | Lai et al. | |
| 2009/0211095 A1 | 8/2009 | Zheng | |
| 2009/0213546 A1 | 8/2009 | Hassani et al. | |
| 2009/0314467 A1 | 12/2009 | Campbell et al. | |
| 2010/0053889 A1 | 3/2010 | Miller et al. | |
| 2010/0091457 A1 | 4/2010 | Krause | |
| 2010/0277868 A1 | 11/2010 | Beaupre et al. | |
| 2011/0141690 A1 | 6/2011 | Le et al. | |
| 2011/0284188 A1 * | 11/2011 | Cai | F28D 15/0266 165/104.26 |
| 2012/0048515 A1 * | 3/2012 | Bhunia | H01L 23/3735 165/104.25 |

OTHER PUBLICATIONS

Chia-Wen Lin, Jiin-Yuh Jang 3D Numerical heat transfer and fluid flow analysis in plate-fin and tube heat exchangers with electrohydrodynamic enhancement Published online: Mar. 9, 2005.

Majid Molki and Piyasak Damronglerd "Electrohydrodynamic Enhancement of Heat Transfer for Developing Air Flow in Square Ducts" Department of Mechanical and Industrial Engineering, Southern Illinois university Edwardsville, Edwardsville, Illinois Nov. 10, 2011.

* cited by examiner

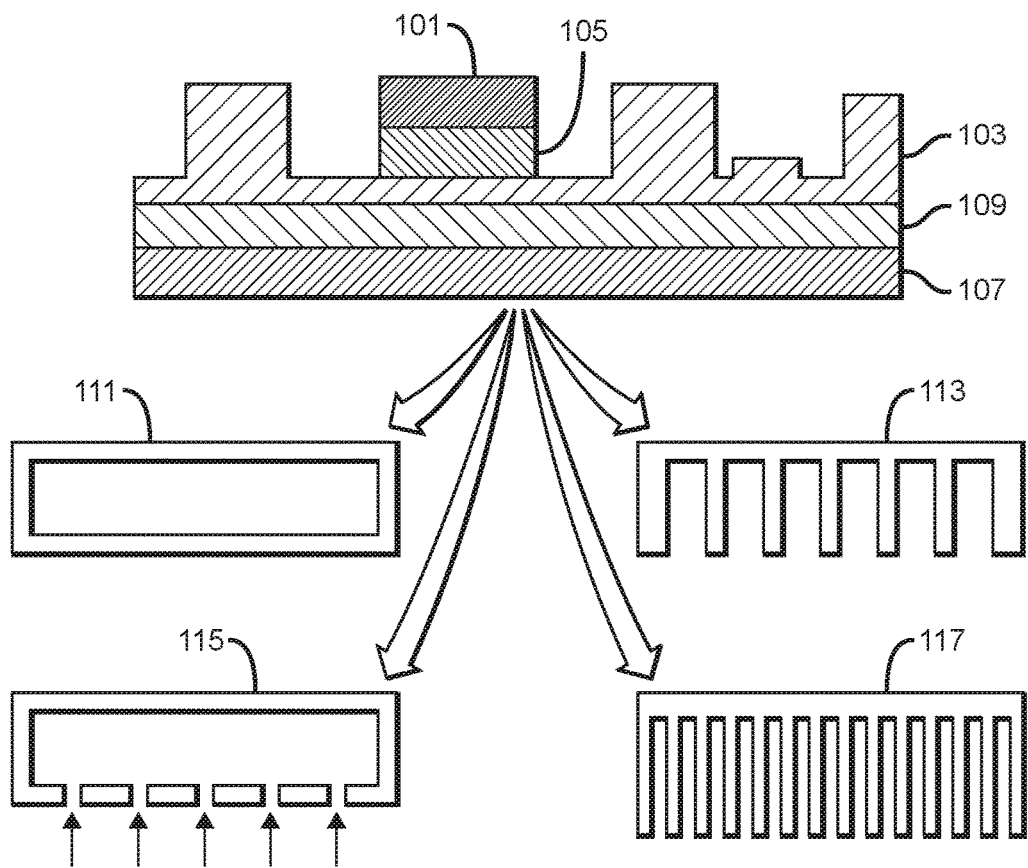
*FIG. 1*
PRIOR ART
*FIG. 2*
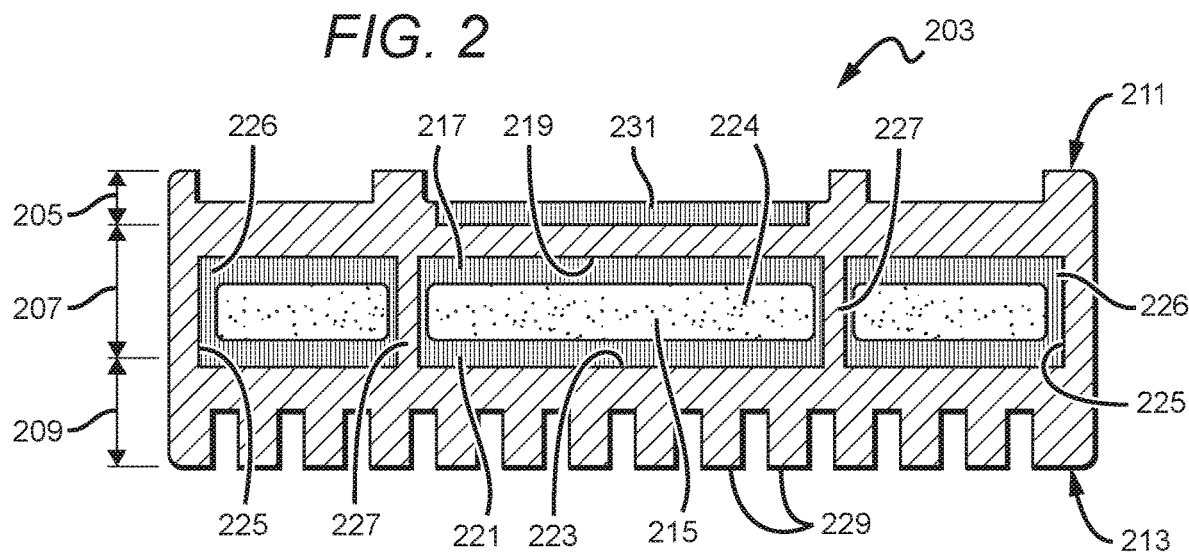

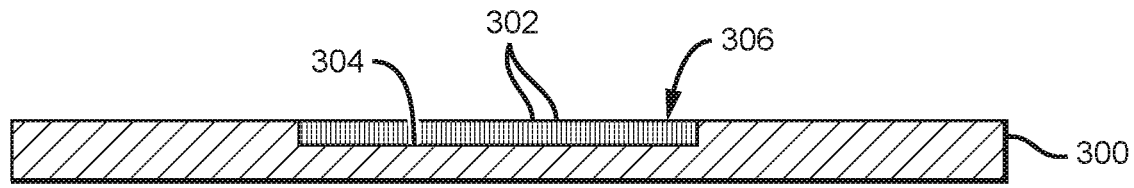
FIG. 3
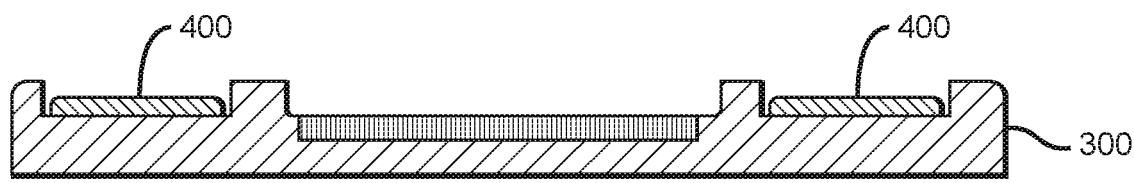
FIG. 4
FIG. 5
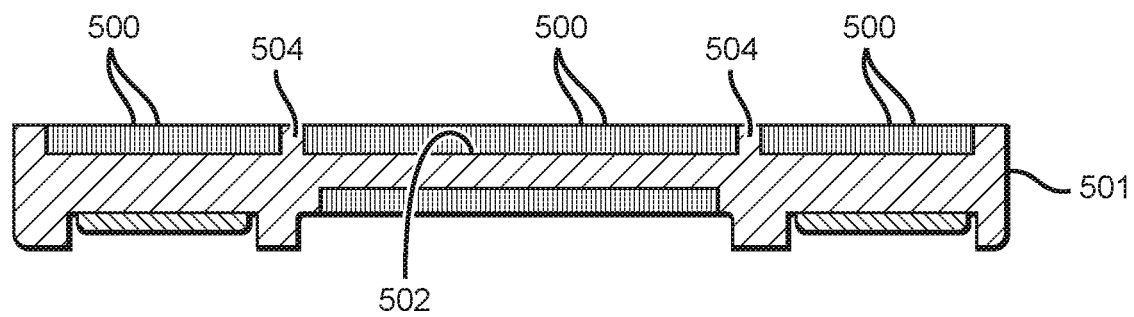

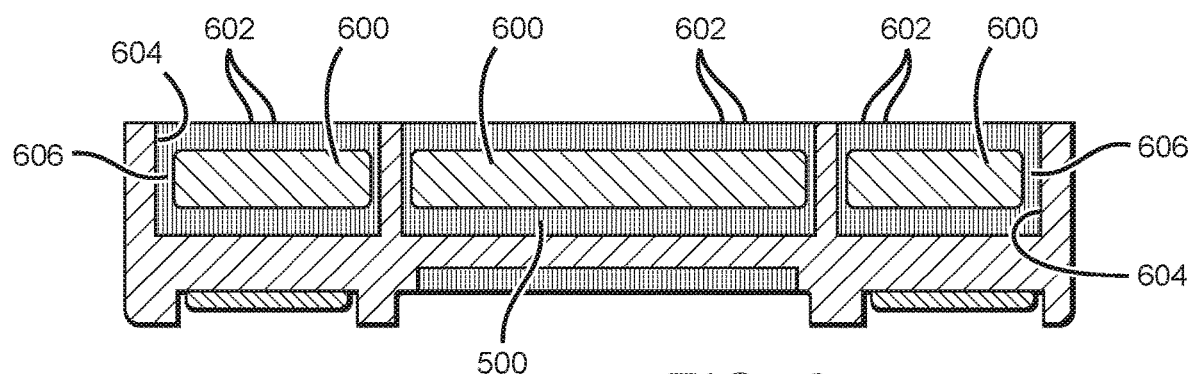
FIG. 6
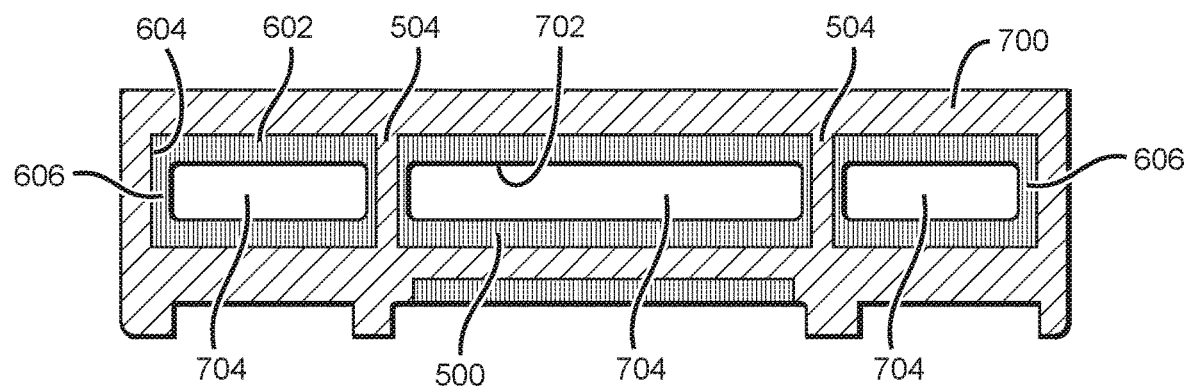
FIG. 7
FIG. 8
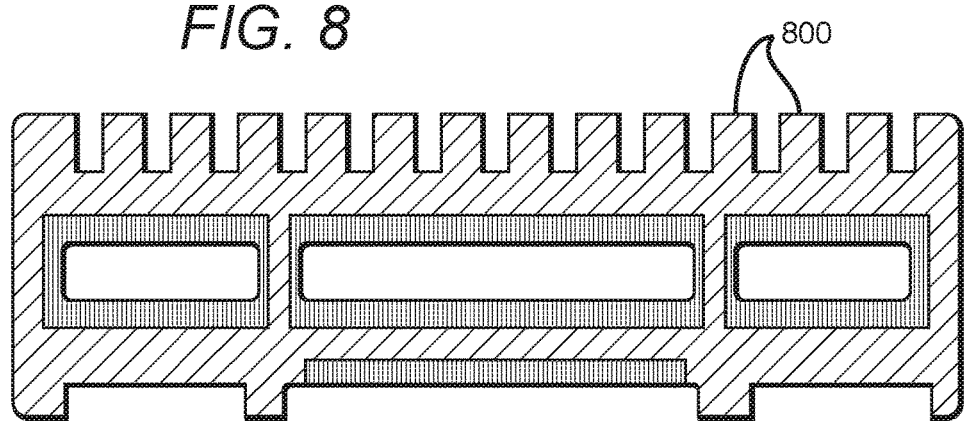

INTERFACE-FREE THERMAL MANAGEMENT SYSTEM FOR HIGH POWER DEVICES CO-FABRICATED WITH ELECTRONIC CIRCUIT

BACKGROUND

Field of the Invention

The invention relates to cooling systems for high-power devices, and more particularly to cooling systems for integrated circuits (ICs).

Description of the Related Art

Power dissipation in electronic circuits remains an important design consideration and is becoming more important as performance for such circuits is becoming thermally limited. In microwave systems, the microwave electronic circuits are manufactured separately from its cooling system using different processes. For example, the cooling system is typically a metal structure that is coupled to the backside of the microwave electronic circuit, though in most cases making placement of a thin thermal interface material (TIM) between the two surfaces to facilitate heat transfer. In one typical example illustrated in FIG. 1, a high-power device 101 may be thermally coupled to a copper mounting plate 103 through a first TIM 105. The TIM 105 provides limited adhesion, a complementary thermal expansion coefficient and thermal path between the device and the copper mounting plate. The copper mounting plate 103 may be coupled to a cooling system 107 through a second TIM 109 that also provides thermal conduction. Examples of cooling systems include vapor chamber 111, micro-channel cooler 113, jet impingement cooler 115, and air-cooled heat sink 117.

SUMMARY

A method of building a thermal-interface-material (TIM)-free thermal management system includes providing a substrate of thermally conductive material, the substrate having an integrated circuit (IC) side, forming cross-sectional layers of a plurality of IC interfaces extending from the IC side, forming cross-sectional layers of a radio-frequency (RF) circuit on the IC side, and forming cross-sectional layers of an enclosure on an opposite side of the substrate from the IC side, so that the thermally-conductive substrate, plurality of IC interfaces, and enclosure form a unitary structure of homogenous thermally-conductive material without a TIM in between.

A thermal-interface-material (TIM)-free thermal management apparatus includes a thermally-conductive unitary structure having an integrated circuit (IC) side and cooling system side, the thermally-conductive unitary structure comprising a plurality of high aspect ratio micro-pillars or porous structures extending from the IC side and a cooling system extending from the cooling system side, with the cooling system selected from the group consisting of: a vapor chamber, micro-channel cooler, jet-impingement chamber, and air-cooled heat sink, so that the cooling system and the plurality of high aspect ratio micro-pillars form part of the same homogenous and thermally-conductive unitary structure.

An apparatus may include an integrated and unitary body of homogenous material having an integrated circuit layer, a first heat exchange layer selected from the group consisting of a vapor chamber, micro-channel cooler, jet-impingement chamber, and air-cooled heat sink; and a second heat exchange layer selected from the group consisting of fins and tabs.

BRIEF DESCRIPTION OF THE DRAWINGS

The components in the figures are not necessarily to scale, emphasis instead being placed upon illustrating the principals of the invention. Like reference numerals designate corresponding parts throughout the different views.

FIG. 1 is a block diagram illustrating a variety of different prior art cooling systems available for thermal coupling to a high-power device through a copper mounting plate;

FIG. 2 is a cross sectional view of one embodiment of a thermal-interface-material free thermal management apparatus having a vapor chamber heat sink in communication with an integrated circuit (IC) through a plurality of IC interfaces and having copper fins;

FIGS. 3-8 illustrate one embodiment of manufacturing steps to create the thermal-interface-material free thermal management apparatus first illustrated in FIG. 2;

DETAILED DESCRIPTION

Figure 9:
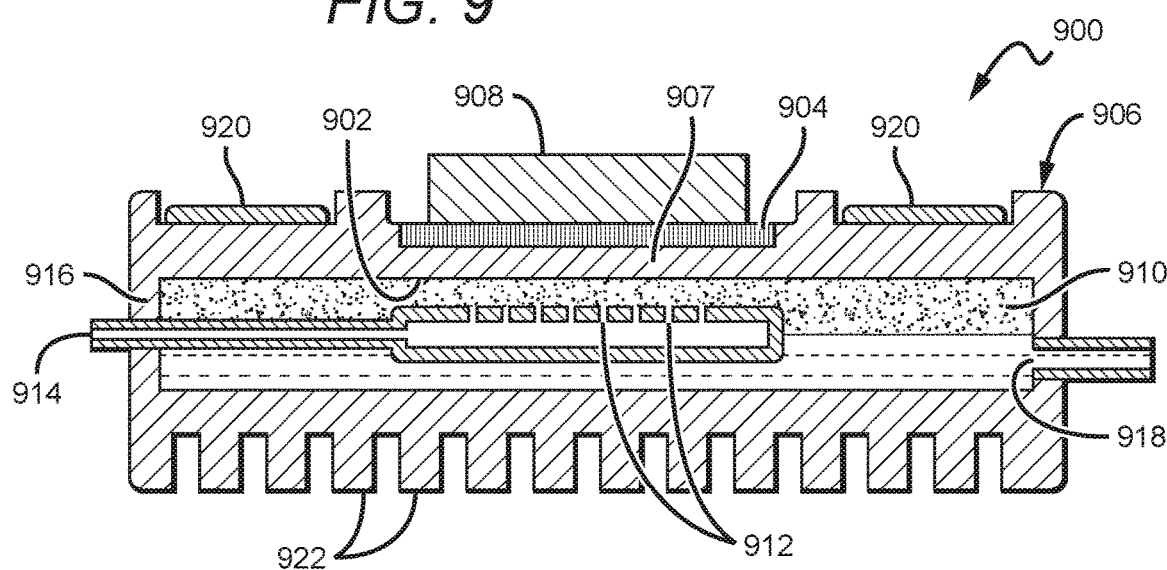
FIG. 9 illustrates another embodiment of a thermal-interface-material free thermal management apparatus having an internal liquid jet array in communication with an integrated circuit (IC) through a plurality of IC interfaces and having copper fins.

A thermal-interface-material (TIM)-free thermal management system and its method of building are described that allows fabrication of a vapor chamber enclosure or other cooling system directly on the backside of a high-power device of an electronic circuit. By providing a substrate of thermally conductive material, the substrate having an integrated circuit (IC) side; forming cross-sectional layers of a plurality of IC interfaces extending from the IC side; forming cross-sectional layers of a radio-frequency (RF) circuit on the IC side; and forming cross-sectional layers of an enclosure on an opposite side of the substrate from the IC side; a unitary structure of homogenous thermally-conductive material is created without a TIM in between the constituent regions, using a layer-based additive manufacturing technique.

FIG. 2 illustrates one embodiment of a thermally-conductive unitary structure that is TIM-free for use as a cooling system for high-power devices such as a monolithic microwave integrated circuit ("IC") or power amplifier. The TIM-free structure is a thermally-conductive unitary structure 203 that may have an IC region 205, a first heat transfer region 207 and a second heat transfer region 209. For purposes of this description, the IC region 205 may generally be described as being on an IC side 211 of the unitary structure 203 and encompassing the layers of material (see below) on which the IC is seated or otherwise embedded. The first and second heat transfer regions (207, 209) may be described as being on a cooling system side 213 that extends from the IC region 205, with the first and second heat transfer regions (207, 209) collectively described as a cooling system. In the embodiment illustrated in FIG. 2, the first heat transfer region 207 of the unitary structure 203 includes a vapor cell 215 formed in the unitary structure 203. The vapor cell 215 may have a plurality of wicks that may include evaporative wicks 217 extending from an evaporation surface 219 towards a center region 224 of the vapor chamber 215, and a plurality of condensation wicks 221 extending from a condensation surface 223 towards the center region 224 of the vapor chamber 215. The evaporative and condensation wicks (217, 221) are microstructures with appropriate internal interstitial voids that generate a capillary pull in liquid flowing through the respective microstructures (i.e., generating a "wick pumping action"). Sidewalls 225 may also support wall wicks 226 that provide a liquid path between the condensation wicks 221 and evaporative wicks 217. In embodiments, evaporative wicks 217 and condensation wicks 221 may each have a height of approximately 100 microns to 1 mm, a diameter or width of 5 to 200 µm and may establish a pore size of approximately 1 to 100 µm.

During operation, heat emitted from the high-power device seated on an exterior surface of the unitary structure 203 (i.e., on the IC side 211) would be received by the unitary structure 203 and conducted through the IC region 205 for presentation to the evaporation surface 219 and into the evaporation wick 217 that are each formed with the unitary structure 203. If the evaporative wick 217 is charged with a liquid, the liquid would be evaporated from the evaporation surface 219 and from the evaporation wick 217 and transported as vapor (illustrated as dispersed dots) through the center region 224. The vapor is then condensed on condensation surface 221 and the condensation wicks 221. The condensate (now in the form of a liquid) may be transported using a wick pumping action through the condensation wicks 221 back up through the wall wicks 226 that are liquid communication with the evaporation surface 219 through the evaporation wicks 217. Support pillars 227 formed in the unitary structure 203 may extend between the evaporation surface 219 and condensation surface 223 to provide structural support for the unitary structure 203. Support pillars 227 may also include support pillar wicks 228 disposed on the supporting pillars 227 to facilitate the condensate return from the condenser wick 221 to the evaporator wick 217 and condensation wicks 221. In one embodiment, the support pillar wicks 228 are grooved structures formed in the support pillars 227 as the unitary structure 203 layers are built up.

The second heat transfer region 209 of the unitary structure 203 may have a plurality of fins 229 to further increase the surface area available for heat dissipation, such as air-cooled heat sink fins, or plurality of channels, such as liquid-cooled cold plate, extending externally and away from the vapor chamber 215 on the cooling system side 213. Such fins 229 would be formed in the same process used to create the remainder of the unitary structure 203, including the vapor chamber 215 and associated evaporation wicks 217 and condensation wicks 221.

The unitary structure 203 may also be formed with an integrated circuit (IC) interface in the form of a plurality of high aspect ratio micro-pillars 231 extending away from the IC side 211 to receive a high-power device (not shown). In such an embodiment, the micro-pillars 231 may elastically deform along their length as a heat differential is developed between the heat source (not shown) and the unitary structure 203 for improved coefficient of thermal expansion ($C_{TE}$) thermal mismatch correction.

FIGS. 3 through 8 illustrate fabrication steps for one implementation of the thermally-conductive unitary structure of FIG. 2 using a layer-based additive manufacturing technique. FIG. 3 illustrates a first step showing a substrate of thermally conductive material 300 provided for subsequent manufacturing steps, either by placement of pre-manufactured thermally conductive material 300 or by forming cross-sectional layers of a substrate using a layer-based additive manufacturing technique such as electroplating, electron beam melting (EBM), selective laser melting (SLM), electron beam evaporation (EBE), and selective laser sintering (SLS). The composition of the thermally conductive material 300 is not critical, although use of metals such as copper (Cu), Silver, (Ag), Nickel (Ni), gold (Au) may be advantageous. The preferred embodiment utilizes copper (Cu). A plurality of high aspect ratio micro-pillars or porous structures 302 may be built up using cross-sectional layers, thereby extending the unitary body of the substrate, preferably through use of electroplating, EBM, SLM, EBE or SLS techniques. For example, if the substrate is formed using a particular layer-based additive manufacturing technique, the high aspect ratio micro-pillars 302 would be formed using the same technique and presumably within the same set of processing steps to reduce the cost and time of manufacturing from what would otherwise exist if the substrate had to be removed from the assembly for further processing elsewhere. Or, if the substrate is a preformed substrate, then the type of layer-based additive manufacturing technique may be chosen according to the preferred technique for the remainder of the unitary structure fabrication. Whether selected for creation of the substrate or chosen for use after a substrate is provided, the layer-based additive manufacturing technique selected may be referred to as the "chosen layer-based additive manufacturing technique." The high aspect ratio micro-pillars 302 may be created over an area that approximates the size of a to-be-seated high-power device. In one embodiment, the array 306 may have a length and width of 5-7 mm and each of the plurality of micro-pillars 302 a height and diameter of 10-1000 µm and 1-50 µm, respectively. The top surface of the micro-pillars should be deposited with a solder layer for attachment of the electronic device. In further embodiments, the plurality of micro-pillars may be omitted.

In FIG. 4, the fabrication illustrated in FIG. 3 is modified by forming cross-sectional layers of electrical circuit portions 400 using the chosen layer-based additive manufacturing technique used in FIG. 3, so that the unitary structure of substrate 300 is dimensionally extended. In an alternative embodiment, a different thermally conductive material is used with the chosen layer-based additive manufacturing technique. For example, if the chosen layer-based additive manufacturing technique is electroplating, a first metal may be layered to form the high aspect ratio micro-pillars 302, and a second metal may be layered to form the electrical circuit portions.

In FIG. 5, the structure of FIG. 4 is modified by forming cross-sectional layers of a plurality of evaporative wicks 500. In one embodiment, the substrate 300, now referred to a "unitary structure" 501 to emphasize that each of the described structures is made using the same layer-based additive manufacturing technique, is illustrated as having been rotated from the orientation of FIG. 4 to facilitate creation of cross-sectional layers forming a plurality of evaporative wicks 500 extending from what may be an evaporation surface 502 during operation. The evaporative wicks 500 are preferably formed using layers of the same material used for each of the previously described structures (300, 302, 400), such as Cu. Each of the plurality of evaporative wicks 500 may be layered to a height of approximately 100 microns to 1 mm, a diameter of approximately 1-500 microns, and collectively have a pore size (gap size) of approximately of 1-50 microns. FIG. 5 also illustrates the beginning formation of support pillars 504.

In FIG. 6, the structure of FIG. 5 is modified by forming additional cross-sectional layers of support pillars and creation of condensation wicks and sidewalls. A sacrificial layer 600 may be layered over the evaporative wicks 500 to support layered formation of condensation wicks 602 using the chosen layer-based additive manufacturing technique. Sidewalls 604 are also formed, with wall wicks 606 extending from the sidewalls 604 to provide a liquid transport path between the condensation wicks 602 and evaporative wicks 500 using the chosen layer-based additive manufacturing technique. Wick (not shown) may also be formed on the supporting pillars 504 to form liquid transport path between condensation wick 602 and evaporative wick 500. In FIG. 7, the structure of FIG. 6 is modified by forming an additional support 700 that is a layered extension of the support pillars 504 and sidewalls 604 and that, during operation, may establish a condensation surface 702. Both the support pillars 504 and sidewalls 604 provide structural support between the evaporation and condensation surfaces (502, 702). In one embodiment, the sidewalls 604, evaporation surface 502 and condensation surface 702 establish a hermetically sealed enclosure that, with the evaporative, wall and condensation wicks (500, 606, 602), establish a vapor chamber 704 that is formed as a unitary structure with the high aspect ratio micro-pillars 302 and original substrate 300. FIG. 8, the fabrication illustrated in FIG. 7 is modified by forming cross-sectional layers of thermally-conductive fins 800 to extend the heat transfer surface area available for heat transfer to receiving air (or liquid coolant).

FIG. 9 illustrates an alternative embodiment of a TIM-free thermal management apparatus that has a plurality of IC interfaces in thermal communication with a cooling system that are collectively in a thermally conductive unitary structure. The plurality of IC interfaces may be in the form of high aspect ratio micro-pillars 904 formed with the unitary structure 900 and extending from an IC side 906 of the unitary structure 900 to receive a high-power device 908. Heat may be conducted from the high-power device 908 through the high aspect ratio micro-pillars 904 and into the IC side 906 of the unitary structure 900 for presentation to an jet impingement surface 902 (alternatively referred to as a heat acquisition surface) within an enclosure 910 such a jet impingement cooler. An array of micro-jets 912 may be disposed in complementary opposition to the jet impingement surface 902. An inlet 914 is provided in a first wall 916 of the enclosure for delivery of liquid to the array of micro-jets 912. Although each micro-jet 912 is illustrated having input and exit nozzles (912a, 912b) preferably having substantially similar diameters, each micro-jet 406 may have converging or diverging nozzles or have nozzles that incorporate other geometries to enable targeted spraying of coolant onto the evaporation surface 902. The coolant can be water, refrigerant, industrial liquid such as water/glycol mixtures, fuel, or any other heat transfer fluid.

In one embodiment, the jet impingement surface 902 may include microstructure tabs 914 that are formed as a part of the unitary structure 900. The preferred height of each microstructure tab 914 may be comparable to the boundary layer thickness of the chosen coolant impinging on the jet impingement surface during operation. For example, if water is used as a phase-change material for direct spray impingement on the fluid impingement surface 902, each microstructure tab 914 preferably has a square base measuring 150 µm on each side, is 150 µm tall and forms a top square shelf measuring 150 µm on each side in order to provide a continuous redevelopment of coolant thermal boundary layers during operation and to provide ridges to facilitate drainage of liquid away from the fluid impingement side 902, as the fluid impingement side 902 is preferably "upside down" in the system illustrated in FIG. 9. In such an embodiment, a fluid impingement surface 902 measuring 52 mm×23 mm has 2,300 microstructure tabs 914 spaced apart approximately 500-900 µm. The surface area of the fluid impingement surface, formed in the same process as the remainder of the unitary body 900, is thus increased by approximately 22% in comparison to a flat surface to facilitate thermal transfer of excess heat from the IC side 906 to the impinging coolant during operation. An outlet 918 is formed on another wall of enclosure to receive the spent liquid for removal from the enclosure 910.

A microwave circuit 920 may be formed with the unitary body, as may be a plurality of copper fins 922 for transport of heat from the high-power device 908. In an alternative embodiment, the copper fins 922 may instead take the form of tabs, alternatively referred to as flaps, protrusions, pillars, bumps, or projections.

Figure 10:
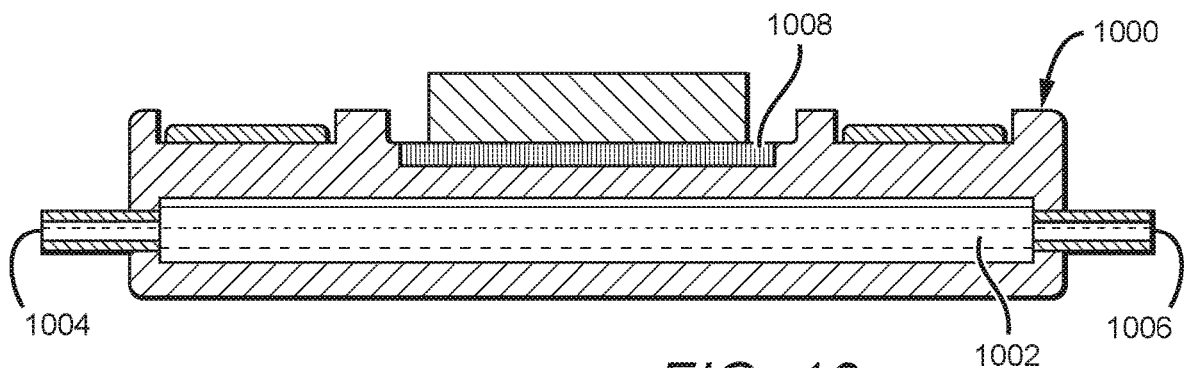
FIG. 10 illustrates another embodiment of a thermal-interface-material free thermal management apparatus having a liquid flow channel.

FIG. 10 illustrates another embodiment of a thermal-interface-material free thermal management apparatus that has a liquid flow channel to remove excess heat from a high powered device. The unitary body 1000 is formed having an internal liquid flow channel 1002 that receives liquid through an inlet 1004, and having an outlet 1006. The unitary body 1000 has a plurality of high aspect ratio micro-pillars 1008 formed with the remainder of the unitary body 1000 using a layer-based additive manufacturing technique such as that described above.

We claim:
1. A thermal-interface-material (TIM)-free thermal management apparatus, comprising:
a thermally-conductive unitary structure comprising:
an integrated circuit (IC) side;
a cooling system side oppositely disposed from the IC side;
a plurality of micro-pillars extending outwardly from the IC side, wherein the micro-pillars comprise a height in a range of 10 micrometers to 1000 micrometers and a diameter in a range of 1 micrometer to 50 micrometers; and
a cooling system extending from the cooling system side, the cooling system selected from the group: a vapor chamber, a micro-channel cooler, a jet-impingement chamber, or an air-cooled heat sink;
wherein the IC side, the cooling system side, the cooling system, and the plurality of micro-pillars or porous structures are parts of a monolithic body without a thermal-interface-material in between the parts.

2. The apparatus of claim 1, wherein the cooling system is a jet impingement cooler and wherein the unitary structure further comprises:
an array of jets disposed in complementary opposition to a heat acquisition surface within the jet impingement cooler.

3. The apparatus of claim 1, further comprising:
a device configured to emit heat seated on the plurality of micro-pillars.

4. The apparatus of claim 1, wherein the thermally-conductive unitary structure further comprises an electrical circuit portion.

5. An apparatus, comprising:
an integrated and unitary body of homogenous material having:
an integrated circuit (IC) layer;

a plurality of micro-pillars extending from the IC layer, wherein the micro-pillars comprise a height in a range of 10 micrometers to 1000 micrometers and a diameter in a range of 1 micrometer to 50 micrometers;

a first heat exchange layer in thermal communication with the integrated circuit layer, the first heat exchange layer selected from the group: a vapor chamber, a micro-channel cooler, a jet-impingement cooler, or an air-cooled heat sink; and a second heat exchange layer in thermal communication with the first heat exchange layer, the second heat exchange layer selected from the group comprising a plurality of fins or tabs, wherein the IC layer, the first heat exchange layer, and second heat exchange layer are parts of a monolithic body without a thermal-interface-material in between the parts.

6. The apparatus of claim 1, further comprising a solder layer deposited on the micro-pillars.

7. The apparatus of claim 1, wherein the thermally-conductive unitary structure is formed by additive manufacturing.

8. The apparatus of claim 1, wherein the micro-pillars are configured to elastically deform along a length responsive to a heat differential.

9. The apparatus of claim 5, further comprising a solder layer deposited on the micro-pillars.

10. The apparatus of claim 9, wherein the solder layer is configured to for attachment of an electronic device.

11. The apparatus of claim 5, wherein the integrated and unitary body of homogenous material is formed by additive manufacturing.

12. The apparatus of claim 5, wherein the micro-pillars are configured to elastically deform along a length responsive to a heat differential.

* * * * *